US011760854B2

(12) United States Patent
Mimura et al.

(10) Patent No.: US 11,760,854 B2
(45) Date of Patent: Sep. 19, 2023

(54) GAS BARRIER LAMINATED BODY, METHOD FOR PRODUCING SAME, MEMBER FOR ELECTRONIC DEVICE, AND ELECTRONIC DEVICE

(71) Applicant: LINTEC CORPORATION, Tokyo (JP)

(72) Inventors: Toshifumi Mimura, Tokyo (JP); Yuuta Suzuki, Tokyo (JP); Satoshi Naganawa, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 893 days.

(21) Appl. No.: 15/316,034

(22) PCT Filed: Jun. 2, 2015

(86) PCT No.: PCT/JP2015/065871
§ 371 (c)(1),
(2) Date: Dec. 2, 2016

(87) PCT Pub. No.: WO2015/186694
PCT Pub. Date: Dec. 10, 2015

(65) Prior Publication Data
US 2017/0088684 A1     Mar. 30, 2017

(30) Foreign Application Priority Data
Jun. 4, 2014 (JP) .................. 2014-115477

(51) Int. Cl.
| C08J 7/048 | (2020.01) |
| C23C 14/08 | (2006.01) |
| B05D 1/00 | (2006.01) |
| C08J 7/04 | (2020.01) |
| C08J 7/043 | (2020.01) |
| B05D 5/00 | (2006.01) |
| B05D 7/04 | (2006.01) |
| B05D 7/00 | (2006.01) |
| C23C 14/00 | (2006.01) |

(52) U.S. Cl.
CPC ............... C08J 7/048 (2020.01); B05D 1/60 (2013.01); B05D 1/62 (2013.01); B05D 5/00 (2013.01); B05D 7/04 (2013.01); B05D 7/51 (2013.01); C08J 7/043 (2020.01); C08J 7/0427 (2020.01); C23C 14/0036 (2013.01); C23C 14/086 (2013.01); *C08J 2383/16* (2013.01)

(58) Field of Classification Search
CPC .. C08J 7/045; C08J 7/047; C09D 1/00; C23C 14/086; C23C 14/10; C23C 16/402; C23C 16/407; B32B 27/06; B32B 27/08; B32B 2307/7242; B32B 2307/7246; H05K 5/065
See application file for complete search history.

(56) References Cited

U.S. PATENT DOCUMENTS

| 2011/0122486 A1* | 5/2011 | Busch ............... C23C 16/45523 359/359 |
| 2012/0107607 A1* | 5/2012 | Takaki ..................... C08J 7/047 428/336 |
| 2013/0115423 A1 | 5/2013 | Ii et al. |
| 2013/0236710 A1* | 9/2013 | Honda ................... C23C 16/483 428/212 |
| 2013/0252002 A1* | 9/2013 | Suzuki ................... H05B 33/04 428/448 |
| 2014/0127630 A1* | 5/2014 | Shinde .................... G03F 7/091 430/322 |

FOREIGN PATENT DOCUMENTS

| JP | 62-195024 A | 8/1987 |
| JP | 63-81122 A | 4/1988 |
| JP | 1-138108 A | 5/1989 |
| JP | 2-84437 A | 3/1990 |
| JP | 2-175726 A | 7/1990 |

(Continued)

OTHER PUBLICATIONS

International Preliminary Report on Patentability and Written Opinion of the International Searching Authority (PCT/IB/373,PCT/ISA/237), dated Dec. 6, 2016, for International Application No. PCT/JP2015/065871, with an English translation.

(Continued)

*Primary Examiner* — Joanna Pleszczynska
(74) *Attorney, Agent, or Firm* — Birch, Stewart, Kolasch & Birch, LLP

(57) ABSTRACT

The present invention is a gas barrier laminate comprising a base unit that comprises a base and a modification-promoting layer, and a gas barrier layer that is formed on a side of the modification-promoting layer with respect to the base unit, the modification-promoting layer having a modulus of elasticity at 23° C. of less than 30 GPa, the base unit having a water vapor transmission rate at a temperature of 40° C. and a relative humidity of 90% of 1.0 g/(m²·day) or less, and the gas barrier layer being a layer formed by applying a modification treatment to a surface of a layer that comprises a polysilazane-based compound and is formed on the side of the modification-promoting layer with respect to the base unit, and a method for producing the gas barrier laminat, and an electronic device member comprising the gas barrier laminate, and an electronic device comprising the electronic device member.

11 Claims, 1 Drawing Sheet

(56) References Cited

FOREIGN PATENT DOCUMENTS

| | | | |
|---|---:|---|---:|
| JP | 4-63833 | A | 2/1992 |
| JP | 5-238827 | A | 9/1993 |
| JP | 5-345826 | A | 12/1993 |
| JP | 6-122852 | A | 5/1994 |
| JP | 6-299118 | A | 10/1994 |
| JP | 6-306329 | A | 11/1994 |
| JP | 8-281861 | A | 10/1996 |
| JP | 9-31333 | A | 2/1997 |
| JP | 2008-132643 | A | 6/2008 |
| JP | 2009-6582 | A | 1/2009 |
| JP | 2012-61671 | A | 3/2012 |
| JP | 2012-106421 | A | 6/2012 |
| JP | 2013-226757 | A | 11/2013 |
| TW | 201334967 | A1 | 9/2013 |
| WO | WO 2012/014653 | A1 | 2/2012 |

OTHER PUBLICATIONS

Extended European Search Report, dated Feb. 22, 2018, for European Application No. 15802604.
International Search Report for PCT/JP2015/065871 (PCT/ISA/210) dated Sep. 8, 2015.
Written Opinion of the International Searching Authority for PCT/JP2015/065871 (PCT/ISA/237) dated Sep. 8, 2015.
Chinese Office Action and Search Report for corresponding Chinese Application No. 201910180189.X, dated Jul. 13, 2021, with English translation of the Office Action.

* cited by examiner

_US 11,760,854 B2_

GAS BARRIER LAMINATED BODY, METHOD FOR PRODUCING SAME, MEMBER FOR ELECTRONIC DEVICE, AND ELECTRONIC DEVICE

TECHNICAL FIELD

The present invention relates to a gas barrier laminate that exhibits an excellent gas barrier capability and excellent bendability, a method for producing the same, an electronic device member that includes the gas barrier laminate, and an electronic device that includes the electronic device member.

BACKGROUND ART

In recent years, a gas barrier film (i.e., a film in which a gas barrier layer is stacked on a transparent plastic film) has been used for displays (e.g., liquid crystal display and electroluminescence (EL) display) instead of a glass sheet (plate) in order to implement a reduction in thickness, a reduction in weight, flexibility, and the like.

Examples of a gas barrier layer that is used to form the gas barrier film include a deposited layer that is formed using a deposition method, and a modified layer that is formed by modifying a film formed by applying a silicon compound.

A gas barrier film that includes two or more gas barrier layers has been proposed.

For example, Patent Literature 1 discloses a gas barrier film that includes a gas barrier layer unit that is provided on at least one side of a base, wherein the gas barrier layer unit includes a first barrier layer formed using a chemical vapor deposition method, and a second barrier layer formed by applying a modification treatment to a film formed by applying a silicon compound to the first barrier layer, and the second barrier layer includes a non-modified area on the side of the base, and includes a modified area on the side of the surface thereof.

CITATION LIST

Patent Literature

Patent Literature 1: WO2012/014653 (US2013/0115423A1)

SUMMARY OF INVENTION

Technical Problem

The gas barrier film disclosed in Patent Literature I includes a deposited film (first barrier layer) that is formed using a chemical vapor deposition method and exhibits an excellent gas barrier capability.

However, since a deposited film formed using a chemical vapor deposition method normally has a high modulus of elasticity, a gas barrier film that includes such a deposited film exhibits inferior bendability. Therefore, cracks may occur in the deposited film when the gas barrier film is bent, and a significant deterioration in gas barrier capability may occur.

The invention was conceived in view of the above situation. An object of the invention is to provide a gas barrier laminate that exhibits an excellent gas barrier capability and excellent bendability, an electronic device member that includes the gas barrier laminate, and an electronic device that includes the electronic device member.

Solution to Problem

The inventors conducted extensive studies in order to solve the above problem. As a result, the inventors found that a gas barrier laminate that exhibits an excellent gas barrier capability and excellent bendability can be obtained by providing a gas barrier layer on the side of a modification-promoting layer with respect to a base unit, the base unit including a base, and the modification-promoting layer that is provided on the base and exhibits a moderate gas barrier capability and flexibility, and the gas barrier layer being formed by applying a modification treatment to the surface of a layer that includes a polysilazane-based compound. This finding has led to the completion of the invention.

Several aspects of the invention provides the following gas barrier laminate (see (1) to (9)), method for producing a gas barrier laminate (see (10)), electronic device member (see (11)), and electronic device (see (12)).

(1) A gas barrier laminate including a base unit that includes a base and a modification-promoting layer, and a gas barrier layer that is formed on the side of the modification-promoting layer with respect to the base unit, the modification-promoting layer having a modulus of elasticity at 23° C. of less than 30 (3Pa, the base unit having a water vapor transmission rate at a temperature of 40° C. and a relative humidity of 90% of 1.0 $g/(m^2 \cdot day)$ or less, and the gas barrier layer being a layer formed by applying a modification treatment to the surface of a layer that includes a polysilazane-based compound and is formed on the side of the modification-promoting layer with respect to the base unit.

(2) The gas barrier laminate according to (1), wherein the modification-promoting layer has a thickness of 2 μm or less.

(3) The gas barrier laminate according to (1), wherein the modification-promoting layer includes an inorganic compound as the main component.

(4) The gas barrier laminate according to (3), wherein the inorganic compound is zinc tin oxide or silicon oxide.

(5) The gas barrier laminate according to (1), wherein the gas barrier layer includes a modified area that has been modified by the modification treatment and is formed from the surface of the gas barrier layer that is situated opposite to the base unit toward the inside of the gas barrier layer, and the modified area has a thickness of 14 nm to 9.9 μm.

(6) The gas barrier laminate according to (5), wherein the ratio of the thickness of the modified area to the thickness of the gas barrier layer is 10% or more.

(7) The gas barrier laminate according to (5), wherein the ratio of the nitrogen atom content to the oxygen atom content in the modified area is 30 mol % or more.

(8) The gas barrier laminate according to (5), wherein the modified area includes silicon oxynitride.

(9) The gas barrier laminate according to (1), the gas barrier laminate having a water vapor transmission rate at a temperature of 40° C. and a relative humidity of 90% of 0.02 $g/(m^2 \cdot day)$ or less.

(10) A method for producing the gas barrier laminate according to (1), the method including forming the modification-promoting layer on the base using a plasma chemical vapor deposition method, a plasma CVD method, an atmospheric-pressure plasma CVD method, or a reactive sputtering method.

(11)) An electronic device member including the gas barrier laminate according to (1).

(12) An electronic device including the electronic device member according to (11).

Advantageous Effects of Invention

The aspects of the invention thus provide a gas barrier laminate that exhibits an excellent gas barrier capability and excellent bendability, an electronic device member that includes the gas barrier laminate, and an electronic device that includes the electronic device member.

DESCRIPTION OF EMBODIMENTS

Figure 1:
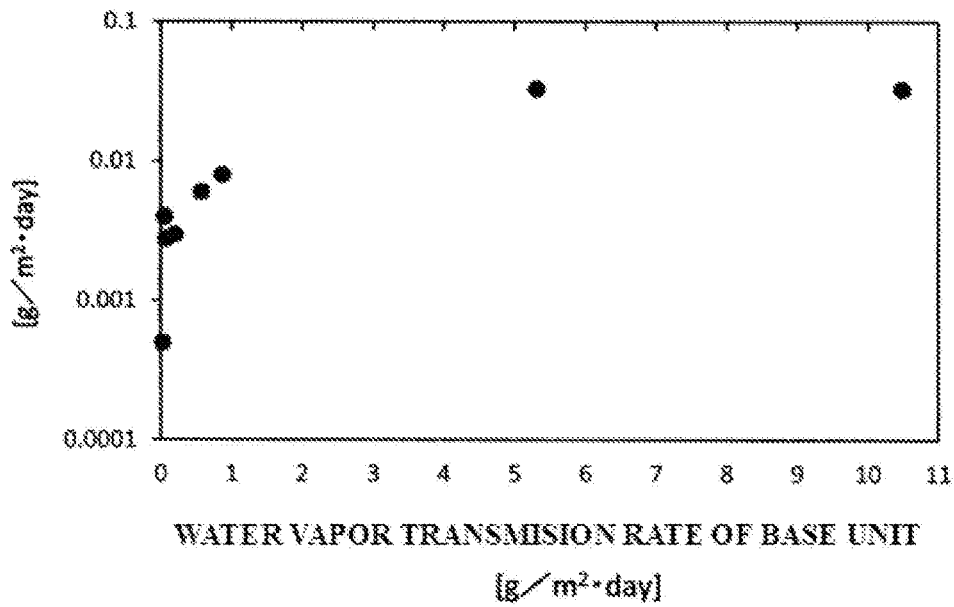
FIG. 1 is a view illustrating the relationship between the water vapor transmission rate of a base unit and the water vapor transmission rate of a gas barrier laminate.

A gas barrier laminate, a method for producing the same, an electronic device member, and an electronic device according to the exemplary embodiments of the invention are described in detail below.

1) Gas barrier laminate and method for producing the same

A gas barrier laminate according to one embodiment of the invention includes a base unit that includes a base and a modification-promoting layer, and a gas barrier layer that is formed on the side of the modification-promoting layer with respect to the base unit, the modification-promoting layer having a modulus of elasticity at 23° C. of less than 30 GPa, the base unit having a water vapor transmission rate at a temperature of 40° C. and a relative humidity of 90% of 1.0 g/(m²·day) or less, and the gas barrier layer being a layer formed by applying a modification treatment to the surface of a layer that includes a polysilazane-based compound and is formed on the side of the modification-promoting layer with respect to the base unit.

(1) Base Unit

The base unit included in the gas barrier laminate according to one embodiment of the invention includes the base and the modification-promoting layer.

The base included in the base unit is not particularly limited as long as the base can support the modification-promoting layer and the gas barrier layer. A film-like or sheet-like material is normally used as the base.

The thickness of the base is not particularly limited, and may be appropriately determined (selected) taking account of the intended use of the gas barrier laminate. The thickness of the base is normally 0.5 to 500, and preferably 1 to 100 µm.

A material for forming the base is not particularly limited as long as the material is suitable for the intended use of the gas barrier laminate according to one embodiment of the invention, Examples of the material for forming the base include a resin (resin base) such as a polyimide, a polyamide, a polyamideimide, a polyphenylene ether, a polyether ketone, a polyether ether ketone, a polyolefin, a polyester, a polycarbonate, a polysulfone, a polyether sulfone, a polyphenylene sulfide, an acrylic-based resin, a cycloolefin-based polymer, and an aromatic polymer; paper (paper base) such as glassine paper, coated paper, and high-quality paper; laminated paper in which a resin is laminated on paper (paper base); and the like.

Among these, a resin (resin base) is preferable due to its excellent transparency and versatility. A polyester, a polyamide, a polysulfone, a polyether sulfone, a polyphenylene sulfide, and a cycloolefin-based polymer are more preferable, and a polyester and a cycloolefin-based polymer are still more preferable.

Examples of the polyester include polyethylene terephthalate, polybutylene terephthalate, polyethylene naphthalate, polyarylate, and the like.

Examples of the polyamide include a wholly aromatic polyamide, nylon 6, nylon 66, a nylon copolymer, and the like.

Examples of the cycloolefin-based polymer include a norbornene-based polymer, a monocyclic olefin-based polymer, a cyclic conjugated diene-based polymer, a vinyl alicyclic hydrocarbon-based polymer, and a hydrogenated product thereof. Specific examples of the cycloolefin-based polymer include APEL (ethylene-cycloolefin copolymer manufactured by Mitsui Chemicals Inc.), ARTON (norbornene-based polymer manufactured by JSR Corporation), ZEONOR (norbornene-based polymer manufactured by Zeon Corporation), and the like.

The modification-promoting layer included in the base unit is a layer that has a moderate gas barrier capability, and reduces or suppresses the entry of water vapor into the layer that includes the polysilazane-based compound (hereinafter may be referred to as "polysilazane layer") from the base to promote the modification of the polysilazane layer.

When the modification treatment is applied to the surface of the polysilazane layer in a state in which the modification-promoting layer is not provided, the polysilazane layer may not be sufficiently modified due to water vapor that has entered the polysilazane layer from the base, and it may be difficult (impossible) to form a gas barrier layer that exhibits an excellent gas barrier capability. It is possible to efficiently form a gas barrier layer that exhibits an excellent gas barrier capability by providing the modification-promoting layer.

It suffices that the modification-promoting layer included in the gas barrier laminate according to one embodiment of the invention have a gas barrier capability sufficient to promote the modification of the polysilazane layer. The modification-promoting layer need not necessarily have an excellent gas barrier capability that directly improves the gas barrier capability of the gas barrier laminate. Specifically, it suffices that the modification-promoting layer have a gas barrier capability that ensures that the water vapor transmission rate of the base unit falls within the range described later.

Since the gas barrier layer (i.e., a layer formed by applying the modification treatment to the surface of the polysilazane layer) normally tends to have a modulus of elasticity and exhibit poor bendability (as described later), it is preferable that the modification-promoting layer included in the gas barrier laminate according to one embodiment of the invention have flexibility so that the modification-promoting layer can reduce or suppress the occurrence of cracks in the gas barrier layer.

The flexibility of the modification-promoting layer may be determined using the modulus of elasticity at 23° C. of the modification-promoting layer as an index. Specifically, the modification-promoting layer has a modulus of elasticity at 23° C. of less than 30 GPa, preferably 2 to 28 GPa, more preferably 3 to 25 GPa, and particularly preferably 3 to 10 GPa.

The modulus of elasticity at 23° C. of the modification-promoting layer may be measured using a nanoindentation method (as described later in connection with the examples).

The modulus of elasticity of the modification-promoting layer varies depending on the components that form the modification-promoting layer, the method used to form the modification-promoting layer, and the like.

Examples of the main component that forms the modification-promoting layer include an inorganic compound and a metal.

Examples of the inorganic compound include an inorganic oxide an inorganic nitride (MNy), an inorganic carbide (MCz), an inorganic oxycarbide (MOxCz), an inorganic carbonitride (MNyCz), an inorganic oxynitride (MOxNy), an inorganic oxycarbonitride (MOxNyCz), and the like. Note that M is a metal element such as silicon, zinc, aluminum, magnesium, indium, calcium, zirconium, titanium, boron, hafnium, barium, or tin, The inorganic compound may include two or more metal elements.

Examples of the metal include aluminum, magnesium, zinc, tin, an alloy of two or more metals among these metals, and the like.

The term "main component" used herein in connection with the modification-promoting layer means that the modification-promoting layer includes the main component in a ratio of 90 mass % or more.

The content of the inorganic compound and the metal in the modification-promoting layer is preferably 95 mass % or more.

The modification-promoting layer may include either or both of one inorganic compound and one metal, or may include either or both of two or more inorganic compounds and two or more metals.

It is preferable that the main component that forms the modification-promoting layer be an inorganic compound, more preferably an inorganic oxide (MOx, $M^1M^2Ox$) or an inorganic oxycarbide (MOxCz, $M^1M^2OxCz$), still more preferably zinc tin oxide (ZTO), silicon oxide (SiOx), silicon oxycarbide (SiOxCz), or silicon oxynitride (SiOxNy), and particularly preferably zinc tin oxide or silicon oxide, since a modification-promoting layer that exhibits a moderate gas barrier capability and has a modulus of elasticity of less than 30 GPa can be efficiently formed.

Note that M in the above compositional formulas is the same as defined above, and $M^1$ and $M^2$ in the above compositional formulas are independently the same metal element as defined above in connection with M.

The modification-promoting layer may be formed using an arbitrary method. For example, the modification-promoting layer may be formed using a physical vapor deposition (PVD) method such as a vacuum deposition method, a sputtering method, a reactive sputtering method, or an ion plating method; a chemical vapor deposition (CVD) method such as a thermal CVD method, a plasma CVD method, an atmospheric-pressure plasma CVD method, or a photo-CVD method; an atomic layer deposition (ALD) method; or the like.

It is preferable to form the modification-promoting layer using a plasma CVD method, an atmospheric-pressure plasma CVD method, or a reactive sputtering method, since a modification-promoting layer that exhibits a moderate gas barrier capability and has a modulus of elasticity of less than 30 GPa can be efficiently formed.

The thickness of the modification-promoting layer is not particularly limited, but is preferably 2 um or less, more preferably 1 to 2,000 nm, still more preferably 10 to 500 nm, and particularly preferably 20 to 300 nm.

The product of the thickness and the modulus of elasticity at 23° C. of the modification-promoting layer is preferably 2,500 N/m or less, and more preferably 2,000 N/m or less. If the product of the thickness and the modulus of elasticity at 23° C. of the modification-promoting layer exceeds 2,500 N/m, the flexural stress of the modification-promoting layer may increase, and the flexibility (bendability) of the gas barrier laminate may deteriorate. The lower limit of the product of the thickness and the modulus of elasticity at 23° C. of the modification-promoting layer is normally 200 N/m.

The base unit included in the gas barrier laminate according to one embodiment of the invention may include an additional layer other than the base and the modification-promoting layer. Examples of the additional layer other than the base and the modification-promoting layer include a primer layer, a conductive layer, an impact-absorbing layer, a pressure-sensitive adhesive layer, a hard coat layer, and the like.

The modification-promoting layer may be formed directly on the base, or may be formed on the base through an additional layer.

It is preferable that the base unit included in the gas barrier laminate according to one embodiment of the invention include a primer layer between the base and the modification-promoting layer. It is possible to improve the adhesion between the base and the modification-promoting layer by providing a primer layer between the base and the modification-promoting layer. Moreover, since the surface of the base having convexities and concavities is covered with the primer layer, it is possible to form the modification-promoting layer on a smooth surface, and easily form a modification-promoting layer that exhibits a moderate gas barrier capability.

The base unit has a water vapor transmission rate at a temperature of 40° C. and a relative humidity of 90% of 1.0 g/(m$^2$·day) or less, preferably 0.05 to 1.0 g/(m$^2$·day), and more preferably 0.1 to 0.9 g/(m$^2$·day).

When the base unit has a water vapor transmission rate at a temperature of 40° C. and a relative humidity of 90% of 1.0 g/(m$^2$·day) or less, it is possible to sufficiently suppress the entry of water vapor into the polysilazane layer from the base. Therefore, it is possible to sufficiently modify the polysilazane layer, and efficiently form a gas barrier layer that exhibits an excellent gas barrier capability.

The effects achieved when the base unit has a water vapor transmission rate at a temperature of 40° C. and a relative humidity of 90% of 1.0 g/(m$^2$·day) or less, the relationship between the water vapor transmission rate of the base unit and the water vapor transmission rate of the gas barrier laminate, are described in detail later in connection with the examples based on FIGS. 1 and 2.

As described above, the base unit included in the gas barrier laminate according to one embodiment of the invention exhibits a moderate gas barrier capability and flexibility. It is possible to obtain the gas barrier laminate according to one embodiment of the invention that exhibits an excellent gas barrier capability and excellent bendability by providing the gas barrier layer formed by applying the modification treatment to the surface of the polysilazane layer on the side of the modification-promoting layer with respect to the base unit (as described layer).

(2) Gas Barrier Layer

The term "gas barrier layer" used herein refers to a layer that does not easily allow gas (e.g., air, oxygen, and water vapor) to pass through.

The gas barrier layer included in the gas barrier laminate according to one embodiment of the invention is a layer formed by applying the modification treatment to the surface of the polysilazane layer that is formed on the side of the modification-promoting layer with respect to the base unit.

The expression "formed on the side of the modification-promoting layer with respect to the base unit" used herein in connection with a layer means that the layer is formed on one side with respect to the base unit so as to be situated relatively closer to the modification-promoting layer than the base. Specifically, the gas barrier laminate according to one embodiment of the invention includes the modification-promoting layer that is formed on the base either directly or through an additional layer, and the gas barrier layer that is formed on the modification-promoting layer either directly or through an additional layer.

Note that the term "gas barrier layer" used herein does not refer to only an area that has been modified by the modification treatment (hereinafter may be referred to as "modified area"), but refers to the entire polysilazane layer including the modified area.

The polysilazane-based compound included in the polysilazane layer is a polymer that includes a repeating unit including an —Si—N— bond (silazane bond) in the molecule. The polysilazane-based compound is preferably a compound that includes a repeating unit represented by the following formula (1).

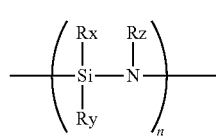

(1)

The number average molecular weight of the polysilazane-based compound is not particularly limited, but is preferably 100 to 50,000.

n in the formula (1) is an arbitrary natural number.

Rx, Ry, and Rz are independently a hydrogen atom or a non-hydrolyzable group such as a substituted or unsubstituted alkyl group, a substituted or unsubstituted cycloalkyl group, a substituted or unsubstituted alkenyl group, a substituted or unsubstituted aryl group, or an alkylsilyl group.

Examples of the alkyl group (that is substituted or un include an alkyl group having 1 to 10 carbon atoms (e.g., methyl group, ethyl group, n-propyl group, isopropyl group, n-butyl group, isobutyl group, sec-butyl group, t-butyl group, n-pentyl group, isopentyl group, neopentyl group, n-hexyl group, n-heptyl group, and n-octyl group).

Examples of the cycloalkyl group (that is substituted or unsubstituted) include a cycloalkyl group having 3 to 10 carbon atoms (e.g., cyclobutyl group, cyclopentyl group, cyclohexyl group, and cycloheptyl group).

Examples of the alkenyl group (that is substituted or unsubstituted) include an alkenyl group having 2 to 10 carbon atoms (e.g., vinyl group, 1-propenyl group, 2-propenyl group, 1-butenyl group, 2-butenyl group, and 3-butenyl group).

Examples of a substituent that may substitute the alkyl group, the cycloalkyl group, and the alkenyl group include a halogen atom such as a fluorine atom, a chlorine atom, a bromine atom, and an iodine atom; a hydroxyl group; a thiol group; an epoxy group; a glycidoxy group; a (meth)acryloyloxy group; a substituted or unsubstituted aryl group such as a phenyl group, a 4-methylphenyl group, and a 4-chlorophenyl group; and the like.

Examples of the aryl group (that is substituted or unsubstituted) include an aryl group having 6 to 10 carbon atoms (e.g., phenyl group, 1-naphthyl group, and 2-naphthyl group).

Examples of a substituent that may substitute the aryl group include a halogen atom such as a fluorine atom, a chlorine atom, a bromine atom, and an iodine atom; an alkyl group having 1 to 6 carbon atoms, such as a methyl group and an ethyl group; an alkoxy group having 1 to 6 carbon atoms, such as a methoxy group and an ethoxy group; a nitro group; a cyano group; a hydroxyl group; a thiol group; an epoxy group; a glycidoxy group; a (meth)acryloyloxy group; a substituted or unsubstituted aryl group such as a phenyl group, a 4-methylphenyl group, and a 4-chlorophenyl group; and the like.

Examples of the alkylsilyl group include a trimethylsilyl group, a triethylsilyl group, a triisopropylsilyl group, a tri-t-butylsilyl group, a methyldiethylsilyl group, a dimethylsilyl group, a diethylsilyl group, a methylsilyl group, an ethylsilyl group, and the like.

A hydrogen atom, an alkyl group having 1 to 6 carbon atoms, and a phenyl group are preferable as Rx, Ry, and Rz, and a hydrogen atom is particularly preferable as Rx, Ry, and Rz.

The polysilazane-based compound that includes the repeating unit represented by the formula (1) may be an inorganic polysilazane in which all of Rx, Ry, and Rz are a hydrogen atom, or an organic polysilazane in which at least one of Rx, Ry, and Rz is not a hydrogen atom.

A modified polysilazane may be used as the polysilazane-based compound. For example, the modified polysilazane disclosed in JP-A-62-195024, JP-A-2-84437, JP-A-63-81122, JP-A-1-138108, JP-A-2-175726, JP-A-5-238827, JP-A-5-238827, JP-A-6-122852 JP-A-6-306329, JP-A-6-299118, JP-A-9-31333, JP-A-5-345826, JP-A-4-63833, or the like may be used as the polysilazane-based compound.

Among these, a perhydropolysilazane in which all of Rx, Ry, and Rz are a hydrogen atom is preferable as the polysilazane-based compound from the viewpoint of availability and a capability to form an ion-implanted layer that exhibits an excellent gas barrier capability.

A product commercially available as a glass coating material or the like may be used directly as the polysilazane-based compound.

These polysilazane-based compounds may be used either alone or in combination.

The content of the polysilazane-based compound in the polysilazane layer is preferably 50 mass % or more, and more preferably 70 mass % or more, since a gas barrier layer that exhibits a further improved gas barrier capability can be obtained.

The polysilazane layer may include a polymer other than the polysilazane-based compound.

Examples of the polymer other than the polysilazane-based compound include a silicon-containing polymer compound other than the polysilazane-based compound (e.g., polycarbosilane-based compound, polysilane-based compound, and polyorganosiloxane-based compound), a polyimide, a polyamide, a polyamide-imide, a polyphenylene ether, a polyether ketone, a polyether ether ketone, a polyolefin, a polyester, a polycarbonate, a polysulfone, a polyether sulfone, a polyphenylene sulfide, a polyarylate, an acrylic-based resin, a cycloolefin-based polymer, an aromatic polymer, and the like.

These polymers may be used either alone or in combination.

When the polysilazane layer includes a polymer other than the polysilazane-based compound, the content of the polymer other than the polysilazane-based compound in the polysilazane layer is normally 30 mass % or less, and preferably 1 to 20 mass %.

The polysilazane layer may include an additional component in addition to the polymer described above as long as the object of the invention is not impaired. Examples of the additional component include a curing agent, an aging preventive, a light stabilizer, aflame retardant, and the like.

The thickness of the polysilazane layer is not particularly limited, but is normally 20 nm to 10 μm, preferably 30 to 500 nm, and more preferably 40 to 200 nm.

According to the embodiments of the invention, a gas barrier laminate that exhibits a sufficient gas barrier capability can be obtained even when the polysilazane layer has a thickness at a nanometer level.

The polysilazane layer may be formed using an arbitrary method. For example, the polysilazane layer may be formed by preparing a polysilazane layer-forming solution that includes a polysilazane-based compound, an optional additional component, a solvent, and the like, applying the polysilazane layer-forming solution using a known method to form a film, and drying the film in air. Part of the polysilazane included in the resulting polysilazane layer reacts with water in air when the film is dried, or after the film has been dried, to produce silicon oxide or silicon oxynitride.

Examples of the solvent used to prepare the polysilazane layer-forming solution include an aromatic hydrocarbon-based solvent such as benzene and toluene; an ester-based solvent such as ethyl acetate and butyl acetate; a ketone-based solvent such as acetone, methyl ethyl ketone, and methyl isobutyl ketone; an aliphatic hydrocarbon-based solvent such as n-pentane, n-hexane, and n-heptane; an alicyclic hydrocarbon-based solvent such as cyclopentane and cyclohexane; and the like.

These solvents may be used either alone or in combination.

The polysilazane layer-forming solution may be applied using mbar coating method, a spin coating method, a dipping method, a roll coating method, a gravure coating method, a knife coating method, an air knife coating method, a roll knife coating method, a die coating method, a screen printing method, a spray coating method, a gravure offset method, or the like.

The film formed by applying the polysilazane layer-forming solution may be dried using a known drying method such as hot-air drying, heat roll drying, or infrared irradiation. The heating temperature is normally 60 to 130° C. The heating time is normally several seconds to several tens of minutes.

The gas barrier layer included in the gas barrier laminate according to one embodiment of the invention is a layer formed by applying the modification treatment to the surface of the layer that includes the polysilazane-based compound and is formed on the side of the modification-promoting layer with respect to the base unit. Specifically, the gas barrier layer includes a modified area that is formed from the surface of the gas barrier layer that is situated opposite to the base unit toward the inside of the gas barrier layer.

The thickness of the modified area may be determined by elemental analysis using X-ray photoelectron spectroscopy (XPS) (as described later in connection with the examples). Specifically, the modified area can be determined by determining a change in the oxygen atom content and the nitrogen atom content in the gas barrier layer in the thickness direction by means of XPS. The thickness of the modified area can be estimated from the time required for sputtering.

The term "modified area" used herein refers to an area of the gas barrier layer in which the ratio (N/O) of the nitrogen atom content to the oxygen atom content is 30 mol % or more, and preferably 40 to 300 mol %, when a change in the oxygen atom content and the nitrogen atom content in the gas barrier layer in the thickness direction is measured by means of XPS. When a change in the oxygen atom content and the nitrogen atom content in the gas barrier layer in the thickness direction is measured, the ratio (N/O) of the nitrogen atom content to the oxygen atom content in the modified area is 30 mol % or more, and is 10 mol % or less in an area of the polysilazane layer other than the modified area (i.e., an area of the polysilazane layer that is situated close to the base (base layer) as compared with the modified area).

The modified area in which the ratio (N/O) of the nitrogen atom content to the oxygen atom content is within the above range exhibits an excellent gas barrier capability.

The thickness of the modified area is not particularly limited, but is normally 14 nm to 9.9 μm, preferably 21 to 495 nm, and more preferably 28 to 198 nm.

The ratio of the thickness of the modified area to the thickness of the entire gas barrier layer is normally 10% or more, preferably 70 to 99%, and more preferably 80 to 98%.

The gas barrier layer included in the gas barrier laminate according to one embodiment of the invention is formed by modifying the polysilazane layer in a state in which the entry of water vapor into the polysilazane layer from the base is reduced or suppressed.

According to this method, since it is possible to sufficiently modify the polysilazane layer so that the thickness of the modified area increases, it is possible to obtain a gas barrier laminate that exhibits an excellent gas barrier capability.

The relationship between the water vapor transmission rate of the base unit and the ratio (%) of the thickness of the modified area to the thickness of the gas barrier layer is described in detail later in connection with the examples based on FIG. 2.

Examples of the modification treatment applied to the polysilazane layer include an ion implantation treatment, a plasma treatment, a UV irradiation treatment, a heat treatment, and the like.

The ion implantation treatment implants ions into the polysilazane layer to modify the polysilazane layer (as described later), The plasma treatment exposes the polysilazane layer to plasma to modify the polysilazane layer. The plasma treatment may be implemented using the method disclosed in JP-A-2012-106421, for example.

The UV irradiation treatment applies UV rays to the polysilazane layer to modify the polysilazane layer. The UV irradiation treatment may be implemented using the method disclosed in JP-A-2013-226757, for example.

The heat treatment heats the polysilazane layer to modify the polysilazane layer. The heat treatment may be implemented using the method disclosed in WO2012/014653, for example.

It is preferable to use the ion implantation treatment since the inner area of the polysilazane layer can also be efficiently modified without roughening the surface of the polysilazane layer, and a gas barrier layer that exhibits a further improved gas barrier capability can be efficiently formed.

Examples of the ions (i.e., ions of the plasma-generating gas described later) that are implanted into the polysilazane layer include ions of a rare gas such as argon, helium, neon, krypton, and xenon; ions of fluorocarbon, hydrogen, nitrogen, oxygen, carbon dioxide, chlorine, fluorine, and sulfur; ions of alkanes such as methane and ethane; ions of alkenes such as ethylene and propylene; ions of alkadienes such as pentadiene and butadiene; ions of alkynes such as acetylene; ions of aromatic hydrocarbons such as benzene and toluene; ions of cycloalkanes such as cyclopropane; ions of cycloalkenes such as cyclopentene; ions of a metal; ions of an organosilicon compound; and the like.

These ions may be used either alone or in combination.

It is preferable to use ions of nitrogen, oxygen, or a rare gas (e.g., argon, helium, neon, krypton, and xenon) since ions can be more easily implanted, and a gas barrier layer that exhibits a further improved gas barrier capability can be obtained.

The ion implantation dose may be appropriately determined (selected) taking account of the intended use of the gas barrier laminate (e.g., desired gas barrier capability and transparency), and the like.

The ions may be implanted using a method that applies ions (ion beams) accelerated by applying an electric field, or a method that implants ions present in a plasma (plasma ion implantation method), for example. It is preferable to use the plasma ion implantation method since the desired gas barrier layer can be easily obtained.

The plasma ion implantation method may be implemented by generating a plasma in an atmosphere including a plasma-generating gas (e.g., rare gas), and implanting ions (cations) present in the plasma into the surface area of the polysilazane layer by applying a negative high-voltage pulse to the polysilazane layer, for example.

The pulse width when applying the negative high-voltage pulse is preferably 1 to 15 sec. When the pulse width is within the above range, it is possible to form a transparent and uniform gas barrier layer. The voltage applied when generating a plasma is preferably −1 to −50 kV, more preferably −1 to −30 kV, and particularly preferably −5 to −20 kV.

The thickness of an area into which ions are implanted may be controlled by appropriately selecting the type of ions and the implantation conditions (e.g., applied voltage and ion implantation time).

(3) Gas Barrier Laminate

The gas barrier laminate according to one embodiment of the invention includes the base unit, and the gas barrier layer that is formed on the side of the modification-promoting layer with respect to the base unit.

The gas barrier laminate according to one embodiment of the invention may include an additional layer other than the base unit and the gas barrier layer.

Examples of the additional layer other than the base unit and the gas barrier layer include a primer layer, a conductive layer, an impact-absorbing layer, a pressure-sensitive adhesive layer, a hard coat layer, a casting sheet, and the like. Note that the casting sheet protects the gas barrier laminate during storage, transportation, and the like. The casting sheet is removed when the gas barrier laminate is used.

The gas barrier layer may be formed directly on the base unit, or may be formed on the base unit through an additional layer.

The gas barrier laminate according to one embodiment of the invention may be produced by forming the modification-promoting layer on the base as described above to obtain the base unit, forming the polysilazane layer on the modification-promoting layer of the base unit, and applying the modification treatment to the surface of the polysilazane layer as described above to form the gas barrier layer, for example.

The thickness of the gas barrier laminate according to one embodiment of the invention is not particularly limited, but is preferably 1 to 1,000 μm, more preferably 10 to 500 μm, and still more preferably 50 to 100 μm.

The gas barrier laminate according to one embodiment of the invention exhibits an excellent gas barrier capability.

The gas barrier laminate according to one embodiment of the invention preferably has a water vapor transmission rate at a temperature of 40° C. and a relative humidity of 90% of 0.02 g/(m²·day) or less, and more preferably 0.01 g/(m²·day) or less. The lower limit of the water vapor transmission rate of the gas barrier laminate according to one embodiment of the invention is not particularly limited, and is preferably as small as possible. The lower limit of the water vapor transmission rate of the gas barrier laminate according to one embodiment of the invention is normally 0.0001 g/(m²·day).

The water vapor transmission rate may be measured using the method described later in connection with the examples.

The gas barrier laminate according to one embodiment of the invention exhibits excellent bendability.

The gas barrier laminate according to one embodiment of the invention exhibits excellent bendability when the bendability of the gas barrier laminate is measured using the method described later in connection with the examples, for example.

The gas barrier laminate according to one embodiment of the invention exhibits an excellent gas barrier capability and excellent bendability as described above, and is preferably used as an electronic device member.

2) Electronic Device Member and Electronic Device

An electronic device member according to one embodiment of the invention includes the gas barrier laminate according to one embodiment of the invention. Since the electronic device member according to one embodiment of the invention exhibits an excellent gas barrier capability, the electronic device member according to one embodiment of the invention can prevent deterioration in an element due to gas (e.g., water vapor). Since the electronic device member according to one embodiment of the invention exhibits excellent bendability, the electronic device member according to one embodiment of the invention may suitably be used as a display member for a liquid crystal display, an EL display, and the like, for example.

An electronic device according to one embodiment of the invention includes the electronic device member according to one embodiment of the invention. Specific examples of the electronic device include a liquid crystal display, an organic EL display, an inorganic EL display, an electronic paper, a solar cell, and the like.

Since the electronic device according to one embodiment of the invention includes the electronic device member that includes the gas barrier laminate according to one embodiment of the invention, a breakdown due to entry of water vapor and the like rarely occurs, and the electronic device exhibits excellent flexibility.

EXAMPLES

The invention is further described below by way of examples. Note that the invention is not limited to the following examples.

The units "parts" and "%" used in connection with the examples respectively refer to "parts by mass" and "mass %" unless otherwise indicated.

Base and Coating Material

The base and the coating material listed below were used in connection with the examples.

Base (I): polyethylene terephthalate film ("PET50A-4100" manufactured by Toyobo Co., Ltd., thickness: 50 μm)

Polysilazane compound-based coating material (1): "Aquamika NL110-20" manufactured by Clariant Japan K.K., solid content: 20%

Measurements

The base units and the gas barrier laminates obtained in Examples 1 to 6 and Comparative Examples 1 to 4 were subjected to the following measurements.

Measurement of Thickness of Modification-Promoting Layer and Thickness of Gas Barrier Layer The thickness of the modification-promoting layer and the thickness of the gas barrier layer were measured using a stylus profilometer ("XP-1" manufactured by Ambios Technology Inc.).

XPS Elemental Analysis

XPS (X-ray photoelectron spectroscopy) elemental analysis was performed using the measurement device and the measurement conditions listed below in order to determine the composition and the thickness of the modified area included in the gas barrier layer.

Measurement device: "PHI Quantera SXM" manufactured by ULVAC-PHI, Incorporated
X-ray source: AlKα
X-ray beam diameter: 100 μm
Electric power: 25 W
Voltage: 15 kV
Take-off angle: 45°
Degree of vacuum: $5.0 \times 10^{-8}$ Pa
Sputtering conditions
Sputtering gas: argon
Applied voltage: −4 kV More specifically, the compositional distribution in the thickness direction was measured by XPS while removing the surface of the gas barrier layer in the depth direction by means of Ar sputtering, and the content ratio ((nitrogen atoms/oxygen atoms)×100) (mol %) of nitrogen atoms to oxygen atoms was calculated.

The thickness of the modified area was calculated based on the time required to remove the modified area by sputtering in accordance with the definition described above in connection with the modified area.

Water Vapor Transmission Rate

The water vapor transmission rate (temperature: 40° C., relative humidity: 90%) of the base unit and the water vapor transmission rate (temperature: 40° C., relative humidity: 90%) of the gas barrier laminate were measured using a water vapor transmission rate measurement device ("AQUATRAN" manufactured by MOCON).

Modulus of Elasticity of Modification-Promoting Layer

The modulus of elasticity at 23° C. of the modification-promoting layer was measured using a surface hardness measurement device ("Nanoindenter" manufactured by MTS).

Bending Test (Gas Barrier Laminate)

The gas barrier laminate having a size of 15×35 cm was wound around a stainless steel rod having a diameter of 8 mm and a length of 20 cm so that the gas barrier layer came in contact with the rod. The gas barrier laminate was caused to make 10,000 round trips (moving distance of gas barrier laminate: 20 cm per round trip) using a folding endurance tester ("IMC-15AE" manufactured by Imoto Machinery Co., Ltd.) at a temperature of 23° C. and a relative humidity of 50% while applying a load of 1.2 kg.

The gas barrier laminate that had been subjected to the bending test was observed using an optical microscope ("VHX-100" manufactured by Keyence Corporation) at a magnification of 2,000, and evaluated in accordance with the following standard.

Very good: No cracks were observed.
Good: Some cracks were observed at a practical level.
Bad: Significant cracks were observed.

Example 1

A silicon oxide film (SiOx film (x=2.33)) (i.e., modification-promoting layer) having a thickness of 58 nm was formed on the base (1) using a plasma chemical vapor deposition method to obtain a base unit 1.

The modification-promoting layer was formed under the following conditions.

Flow rate of hexamethyldisiloxane: 50 sccm
Flow rate of argon gas: 15 seem
Flow rate of oxygen gas: 10 seem
Chamber internal pressure: 0.3 Pa
RF power supply electric power: 1,000 W
Deposition time: 30 sec The polysilazane compound-based coating material (1) was spin-coated onto the modification-promoting layer of the base unit 1, and the resulting film was heated at 120° C. for 2 minutes in air to form a polysilazane layer having a thickness of 150 nm.

Argon (Ar) ions were implanted into the surface of the polysilazane layer under the following conditions using a plasma ion implantation apparatus to form a gas barrier layer to obtain a gas barrier laminate 1.

The details of the plasma ion implantation apparatus and the plasma ion implantation conditions used to form the gas barrier layer are listed below.

Plasma ion implantation apparatus
RF power supply: "RF56000" manufactured by JEOL Ltd.
High-voltage pulse power supply: "PV-3-HSHV-0835" manufactured by Kurita Seisakusho Co., Ltd.
Plasma ion implantation conditions
Plasma-generating gas: Ar
Gas flow rate: 100 sccm
Duty ratio: 0.5%
Applied voltage: −6 kV
RF power supply: frequency: 13.56 MHz, applied electric power: 1,000 W
Chamber internal pressure: 0.2 Pa
Pulse width: 5 μsec
Ion implantation time: 5 min
Line (transfer) speed: 0.2 m/min

Example 2

A gas barrier laminate 2 was obtained in the same manner as in Example 1, except that the deposition time when forming the modification-promoting layer was changed from 30 seconds to 40 seconds in order to form a silicon oxide film having a thickness of 73 nm to obtain a base unit 2, and the gas barrier layer was formed on the base unit 2.

Example 3

A gas barrier laminate 3 was obtained in the same manner as in Example 1, except that the deposition time when forming the modification-promoting layer was changed from 30 seconds to 60 seconds in order to form a silicon oxide film having a thickness of 113 nm to obtain a base unit 3, and the gas barrier layer was formed on the base unit 3.

Example 4

A gas barrier laminate 4 was obtained in the same manner as in Example 1, except that the deposition time when forming the modification-promoting layer was changed from 30 seconds to 120 seconds in order to form a silicon oxide film having a thickness of 250 nm to obtain a base unit 4, and the base unit 4 was used directly.

Example 5

A zinc tin oxide film (ZTO film) (i.e., modification-promoting layer) having a thickness of 110 nm was formed on the base (1) using a reactive sputtering method to obtain a base unit 5.
The modification-promoting layer was formed under the following conditions.
Inert gas: Ar
Reactive gas: $O_2$
Target material: alloy formed of zinc and tin
Electric power: 4,000 W
Deposition (sputtering) pressure: 0.5 Pa
Deposition (sputtering) time: 80 sec
A gas barrier laminate 5 was obtained in the same manner as in Example 1, except that the base unit 5 was used instead of the base unit 1.

Example 6

A gas barrier laminate 6 was obtained in the same manner as in Example 5, except that the deposition time when forming the modification-promoting layer was changed from 80 seconds to 160 seconds in order to form a zinc tin oxide film (ZTO film) having a thickness of 220 nm to obtain a base unit 6, and the base unit 6 was used instead of the base unit 5.

Comparative Example 1

A gas barrier laminate 7 was obtained in the same manner as in Example 1, except that the gas barrier layer was formed directly on the base (1) without providing the modification-promoting layer.

Comparative Example 2

A gas barrier laminate 8 was obtained in the same manner as in Example 1, except that the deposition time when forming the modification-promoting layer was changed to 7 seconds in order to form a silicon oxide film having a thickness of 15 nm to obtain a base unit 8, and the base unit 8 was used instead of the base unit 1.

Comparative Example 3

A gas barrier laminate 9 was obtained in the same manner as in Example 1, except that a silicon oxide film (SiO film) having a thickness of 100 nm was formed using a reactive sputtering method under the following conditions utilizing a reactive sputtering apparatus to obtain a base unit 9, and the base unit 9 was used instead of the base unit 1.
Plasma-generating gas: argon and oxygen
Gas flow rate: argon: 100 seem, oxygen: 60 sccm
Target material: silicon
Electric power: 2,500 W
Vacuum chamber internal pressure: 0.2 Pa

Comparative Example 4

A gas barrier laminate 10 was obtained in the same manner as in Example 1, except that a silicon oxynitride film (SiON film) having a thickness of 100 nm was formed using a reactive sputtering method under the following conditions utilizing a reactive sputtering apparatus to obtain a base unit 10, and the base unit 10 was used instead of the base unit 1.
Plasma-generating gas: argon, nitrogen, and oxygen
Gas flow rate: argon: 100 seem, nitrogen: 60 sccm, oxygen: 40 sccm
Target material: silicon
Electric power: 2,500 W
Vacuum chamber internal pressure: 0.2 Pa The formation method, the type, the thickness, the modulus of elasticity, the product of the thickness and the modulus of elasticity, and the water vapor transmission rate with regard to the modification-promoting layers of the base units of Examples 1 to 6 and Comparative Examples 1 to 4 are listed in Table 1, the thickness, the thickness of the modified area, the ratio of the thickness of the modified area to the thickness of the gas barrier layer, and the ratio of the nitrogen (N) atom content to the oxygen (O) atom content with regard to the gas barrier layers of the gas barrier laminates of Examples 1 to 6 and Comparative Examples 1 to 4 are listed in Table 2, and the water vapor transmission rate and the bending test results with regard to the gas barrier laminates of Examples 1 to 6 and Comparative Examples 1 to 4 are listed in Table 3.

TABLE 1

| | | Base unit | | | | |
| | | Modification-promoting layer | | | | |
| | Modification-promoting layer formation method | Type | Thickness (nm) | Modulus of elasticity (GPa) | Product of thickness and modulus of elasticity (N/m) | Water vapor transmission rate (g/m² · day) |
| --- | --- | --- | --- | --- | --- | --- |
| Example 1 | Plasma chemical vapor deposition method | SiOx | 58 | 5.0 | 290 | 0.87 |
| Example 2 | Plasma chemical vapor deposition method | SiOx | 73 | 3.2 | 234 | 0.57 |

TABLE 1-continued

| | Base unit | | | | | |
|---|---|---|---|---|---|---|
| | Modification-promoting layer | | | | | |
| | Modification-promoting layer formation method | Type | Thickness (nm) | Modulus of elasticity (GPa) | Product of thickness and modulus of elasticity (N/m) | Water vapor transmission rate (g/m² · day) |
| Example 3 | Plasma chemical vapor deposition method | SiOx | 113 | 4.2 | 475 | 0.2 |
| Example 4 | Plasma chemical vapor deposition method | SiOx | 250 | 7.2 | 1,800 | 0.07 |
| Example 5 | Reactive sputtering method | ZTO | 110 | 20.0 | 2,200 | 0.02 or less |
| Example 6 | Reactive sputtering method | ZTO | 220 | 3.5 | 770 | 0.02 or less |
| Comparative Example 1 | — | — | — | — | — | 10.48 |
| Comparative Example 2 | Plasma chemical vapor deposition method | SiOx | 15 | 1.5 | 23 | 5.31 |
| Comparative Example 3 | Reactive sputtering method | SiOx | 100 | 30.0 | 3,000 | 0.05 |
| Comparative Example 4 | Reactive sputtering method | SiON | 100 | 45.0 | 4,500 | 0.02 or less |

TABLE 2

| | Gas barrier layer | | | |
|---|---|---|---|---|
| | | Modified area | | |
| | Thickness (nm) of gas barrier layer | Thickness (nm) of modified area | Ratio (%) of thickness of modified area to thickness of gas barrier layer | Ratio (mol %) of N atom content to O atom content |
| Example 1 | 150 | 141 | 94 | 45 |
| Example 2 | 150 | 141 | 94 | 52 |
| Example 3 | 150 | 141 | 94 | 65 |
| Example 4 | 150 | 141 | 94 | 87 |
| Example 5 | 150 | 132 | 88.2 | 110 |
| Example 6 | 150 | 133 | 88.9 | 208 |
| Comparative Example 1 | 150 | 13.5 | 9 | 51 |
| Comparative Example 2 | 150 | 13.5 | 9 | 51 |
| Comparative Example 3 | 150 | 141 | 94 | 89 |
| Comparative Example 4 | 150 | 141 | 94 | 115 |

TABLE 3

| | Gas barrier laminate | |
|---|---|---|
| | Water vapor transmission rate (g/m² · day) | Bending test |
| Example 1 | 0.008 | Very good |
| Example 2 | 0.006 | Very good |
| Example 3 | 0.003 | Very good |
| Example 4 | 0.003 | Very good |
| Example 5 | 0.0005 or less | Good |
| Example 6 | 0.0005 or less | Very good |
| Comparative Example 1 | 0.033 | Very good |
| Comparative Example 2 | 0.033 | Very good |
| Comparative Example 3 | 0.004 | Bad |
| Comparative Example 4 | 0.0005 or less | Bad |

The following were confirmed from the results listed in Tables 1 to 3.

The base units of the gas barrier laminates of Examples 1 to 6 included the modification-promoting layer exhibiting a moderate gas barrier capability and exhibiting flexibility characterized by a modulus of elasticity of less than 30 GPa, and the ratio of the thickness of the modified area to the thickness of the gas barrier layer formed on the base unit was 10% or more (i.e., the thickness of the modified area was large). The ratio of the nitrogen (N) atom content to the oxygen (O) atom content was 30 mol % or more. The gas barrier laminates of Examples 1 to 6 had a low water vapor transmission rate, and exhibited excellent bendability.

The gas barrier laminate of Comparative Example 1 that did not include a modification-promoting layer, and the gas barrier laminate of Comparative Example 2 that included the modification-promoting layer (base unit) having a water vapor transmission rate at a temperature of 40° C. and a relative humidity of 90% of more than 1.0 g/(m²·day), had a gas barrier layer in which the thickness of the modified area was small. The ratio of the thickness of the modified area to the thickness of the gas barrier layer was less than 10%. The gas barrier laminates of Comparative Examples 1 and 2 had a high water vapor transmission rate (i.e., exhibited a poor water barrier capability) as compared with the gas barrier laminates of Examples 1 to 6.

The gas barrier laminates of Comparative Examples 3 and 4 included a modification-promoting layer having a modulus of elasticity of 30 GPa or more. The gas barrier laminates of Comparative Examples 3 and 4 exhibited poor bendability.

FIG. 1 is a view illustrating the relationship between the water vapor transmission rate of the base unit and the water vapor transmission rate of the gas barrier laminate based on the results obtained in Examples 1 to 6 and Comparative Examples 1 and 2.

In FIG. 1, the horizontal axis indicates the water vapor transmission rate of the base unit, and the vertical axis indicates the water vapor transmission rate of the gas barrier laminate.

When the water vapor transmission rate of the base unit was 1.0 g/(m²·day) or less, the water vapor transmission rate of the gas barrier laminate was 0.01 g/(m²·day) or less (i.e., the gas barrier laminate exhibited an excellent gas barrier capability).

There was a tendency that the water vapor transmission rate of the gas barrier laminate decreased as the water vapor transmission rate of the base unit decreased. Such a relationship was not observed when the water vapor transmission rate of the base unit was high (e.g., when the water vapor transmission rate of the base unit was 5.0 g/(m²·day) or more).

Figure 2:
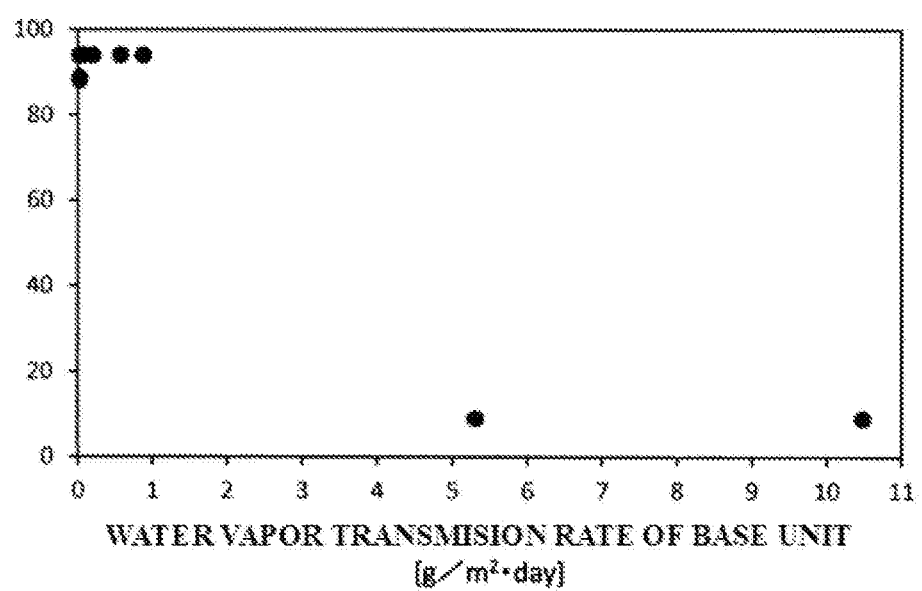
FIG. 2 is a view illustrating the relationship between the water vapor transmission rate of a base unit, and the ratio (%) of the thickness of a modified area to the thickness of a gas barrier layer.

FIG. 2 is a view illustrating the relationship between the water vapor transmission rate of the base unit and the ratio (%) of the thickness of the modified area to the thickness of the gas barrier layer based on the results obtained in Examples 1 to 6 and Comparative Examples 1 and 2.

In FIG. 2, the horizontal axis indicates the water vapor transmission rate of the base unit, and the vertical axis indicates the ratio of the thickness of the modified area to the thickness of the gas barrier layer.

When the water vapor transmission rate of the base unit was 1.0 g/(m²·day) or less, the ratio of the thickness of the modified area to the thickness of the gas barrier layer was sufficiently increased (i.e., the polysilazane layer was sufficiently modified).

It was confirmed from the results illustrated in FIGS. 1 and 2 that the modification of the polysilazane layer is promoted when the base unit has a water vapor transmission rate at a temperature of 40° C. and a relative humidity of 90% of 1.0 g/(m²·day) or less.

The invention claimed is:

1. A gas barrier laminate comprising:
   a base unit that comprises a base and a modification-promoting layer and
   a gas barrier layer, wherein the gas barrier layer is on a side of the modification-promoting layer opposite to the base,
   the modification-promoting layer having a modulus of elasticity at 23° C. of 2 to 7.2 GPa,
   the base unit having a water vapor transmission rate at a temperature of 40° C. and a relative humidity of 90% of 1.0 g/(m²·day) or less, and
   the gas barrier layer being a layer formed by applying a modification treatment to a surface of a layer that comprises a polysilazane-based compound,
   the gas barrier layer comprising a modified area that has been obtained by modification treatment,
   a ratio of a nitrogen atom content to an oxygen atom content the modified area being 30 mol% or more, and
   a product of a thickness of the modification-promoting layer, in units of m, by the modulus of elasticity at 23° C. of the modification-promoting layer, in units of N/m², is 2,200 N/m or less.

2. The gas barrier laminate according to claim 1, wherein the modification-promoting layer has a thickness of 2m or less.

3. The gas barrier laminate according to claim 1, wherein the modification-promoting layer comprises an inorganic compound as a main component.

4. The gas barrier laminate according to claim 3, wherein the inorganic compound is zinc tin oxide or silicon oxide.

5. The gas barrier laminate according to claim 1, wherein the modified area has a thickness of 14 nm to 9.9 μm.

6. The gas barrier laminate according to claim 5, wherein a ratio of a thickness of the modified area to a thickness of the gas barrier layer is 10% or more.

7. The gas barrier laminate according to claim 5, wherein the modified area comprises silicon oxynitride.

8. The gas barrier laminate according to claim 1, the gas barrier laminate having a water vapor transmission rate at a temperature of 40° C. and a relative humidity of 90% of 0.02 g/(m²·day) or less.

9. A method for producing the gas barrier laminate according to claim 1, the method comprising forming the modification-promoting layer on the base using a plasma CVD method, an atmospheric-pressure plasma CVD method, or a reactive sputtering method.

10. An electronic device member comprising the gas barrier laminate according to claim 1.

11. An electronic device comprising the electronic device member according to claim 10.

* * * * *

UNITED STATES PATENT AND TRADEMARK OFFICE
CERTIFICATE OF CORRECTION

| | |
|---|---|
| PATENT NO. | : 11,760,854 B2 |
| APPLICATION NO. | : 15/316034 |
| DATED | : September 19, 2023 |
| INVENTOR(S) | : Toshifumi Mimura et al. |

It is certified that error appears in the above-identified patent and that said Letters Patent is hereby corrected as shown below:

In the Claims

In Column 20, Line 16, in Claim 2:
Change:
"the modification-promoting layer has a thickness of 2m or"
To:
-- the modification-promoting layer has a thickness of 2 $\mu$m or --

Signed and Sealed this
Second Day of January, 2024

Katherine Kelly Vidal
*Director of the United States Patent and Trademark Office*